(12) United States Patent
Martiny et al.

(10) Patent No.: US 11,031,529 B2
(45) Date of Patent: Jun. 8, 2021

(54) WAVELENGTH CONVERTING MATERIAL FOR A LIGHT EMITTING DEVICE

(71) Applicant: Lumileds LLC, San Jose, CA (US)

(72) Inventors: Christoph Martiny, Aachen (DE);
Peter Josef Schmidt, Aachen (DE);
Oliver Steigelmann, Aachen (DE);
Cora Hecht, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/335,608

(22) PCT Filed: Sep. 14, 2017

(86) PCT No.: PCT/EP2017/073122
§ 371 (c)(1),
(2) Date: Mar. 21, 2019

(87) PCT Pub. No.: WO2018/054753
PCT Pub. Date: Mar. 29, 2018

(65) Prior Publication Data
US 2019/0393384 A1    Dec. 26, 2019

(30) Foreign Application Priority Data

Sep. 26, 2016   (EP) ..................... 16190633

(51) Int. Cl.
*H01L 33/26*   (2010.01)
*H01L 33/50*   (2010.01)
*C09K 11/02*   (2006.01)
*C09K 11/77*   (2006.01)

(52) U.S. Cl.
CPC ............ *H01L 33/502* (2013.01); *C09K 11/02* (2013.01); *C09K 11/7734* (2013.01); *H01L 2933/0041* (2013.01)

(58) Field of Classification Search
None
See application file for complete search history.

(56) References Cited

U.S. PATENT DOCUMENTS

| 7,540,977 | B2 | 6/2009 | Hirosaki et al. |
| 2010/0187976 | A1 | 7/2010 | Winkler |
| 2016/0177178 | A1 | 6/2016 | Choi et al. |

FOREIGN PATENT DOCUMENTS

| CN | 101501160 A | 8/2009 |
| EP | 1669429 A2 | 6/2006 |
| EP | 2203539 B1 | 7/2011 |
| EP | 2109651 B1 | 9/2011 |
| TW | 200619358 A | 6/2006 |
| TW | 200815564 A | 4/2008 |

OTHER PUBLICATIONS

EPO as ISA, PCT/EP2017/073122, "International Search Report and Written Opinion", dated Oct. 25, 2017, 14 pages.
Extended EP search Report, EP application No. 16190633, dated Mar. 3, 2017, 9 pages.

*Primary Examiner* — Suberr L Chi

(57) ABSTRACT

Embodiments of the invention include a luminescent ceramic including $(Ba_{1-x}Sr_x)_{2-z}Si_{5-y}O_{4y}N_{8-4y}:Eu_z$ 258 phase wavelength converting material $(0.5 \leq x \leq 0.9; 0 \leq y \leq 1; 0.001 \leq z \leq 0.02)$ and $M_3Si_3O_3N_4$ 3334 phase material (M=Ba, Sr, Eu). The $M_3Si_3O_3N_4$ 3334 phase material comprises no more than 5 weight % of the material.

15 Claims, 3 Drawing Sheets

WAVELENGTH CONVERTING MATERIAL FOR A LIGHT EMITTING DEVICE

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

A light emitting device such as an LED is often combined with a wavelength converting material such as a phosphor. Such devices are often referred to as phosphor-converted LEDs, or PCLEDs. Phosphor may be formed into a ceramic tile that is disposed in the path of light emitted by an LED.

Composite ceramics that comprise $(Ba,Sr,Ca)_{2-x}Si_{5-y}Al_yO_yN_{8-y}:Eu_x$ luminescent ceramic grains as the main constituent are disclosed in EP2109651B1 and EP2203539B1. The references teach ceramic processing methods that are based on providing precursor powders, forming the precursor powders into ceramic green bodies, sintering the ceramic green bodies into densely sintered composite ceramics, and machining the ceramics into tiles that are combined with light emitting LEDs to obtain phosphor-converted LEDs.

DETAILED DESCRIPTION

Figure 1:
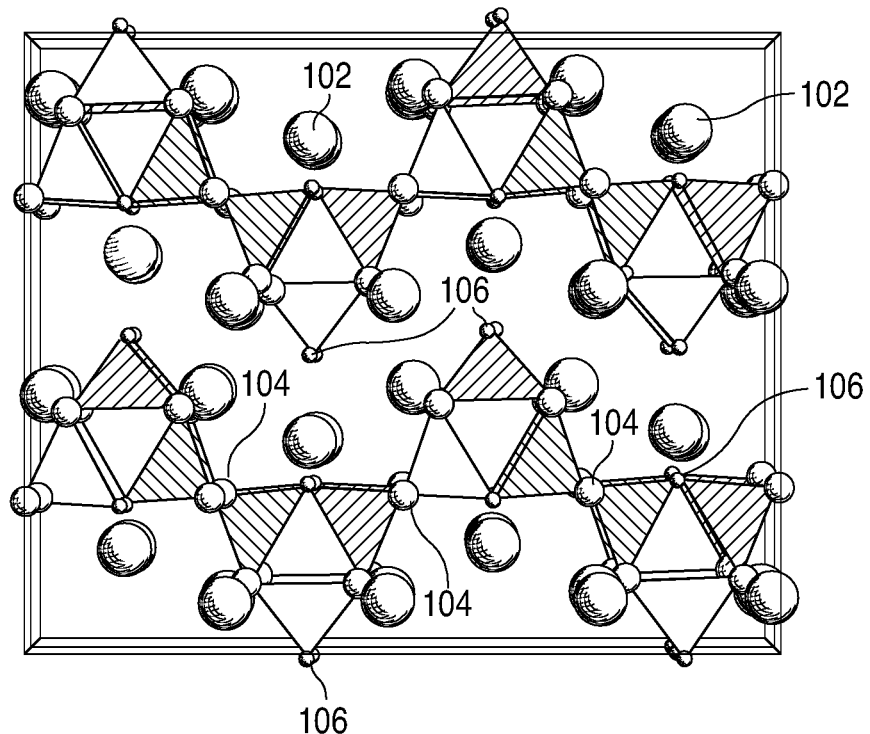
FIG. 1 illustrates the crystal structure of materials according to some embodiments of the invention.

Amber-emitting luminescent ceramic $(Ba,Sr,Ca)_{2-x}Si_{5-y}Al_yO_yN_{8-y}:Eu_x$ may be formed by ambient pressure firing, which often results in a ceramic including two phases, (1) a luminescent $(Ba_{1-x}Sr_x)_{2-z}Si_{5-y}O_{4y}N_{8-4y}:Eu_z$ (258) phase ($0.5 \leq x \leq 0.9$; $0 \leq y \leq 1$; $0.001 \leq z \leq 0.02$), and (2) a non-luminescent $(Ba,Sr)_3Si_3O_3N_4:Eu$ (3334) phase. The 3334 phase is undesirable because it may lower the quantum yield (i.e. the conversion efficiency) of the luminescent ceramic, and may easily hydrolyze in moist air. Hydrolysis leads to the formation of white flakes on the surfaces of the ceramic. The white flakes may cause undesirable scattering of light escaping the ceramic. Also, a ceramic tile is often glued to an LED or other structure, for example by a silicone-based or any other suitable adhesive or glue layer. The white flakes may reduce the adhesion of the glue layer.

In embodiments of the invention, $(Ba,Sr,Ca)_{2-x}Si_{5-y}Al_yO_yN_{8-y}:Eu_x$ ceramic is treated after sintering under high nitrogen pressure at elevated temperatures. The post-sintering thermal treatment (also referred to herein as an anneal) may reduce the amount of the 3334 phase, for example by reducing the oxygen content of the 258 phase and/or by encouraging formation of a crystalline $(Ba,Sr)_2SiO_4:Eu$ (BOSE) phase. The post-sintering thermal treatment may increase conversion efficiency and chemical stability of the ceramic.

In some embodiments, fine powders of $(Ba_{1-x}Sr_x)_{2-z}Si_{5-y}O_{4y}N_{8-4y}:Eu_z$ phase ($0.5 \leq x \leq 0.9$; $0 \leq y \leq 1$; $0.001 \leq z \leq 0.02$), for example with a surface area in the range 2-4 $m^2/g$, are sintered under ambient pressure conditions. These $(Ba_{1-x}Sr_x)_{2-z}Si_{5-y}O_{4y}N_{8-4y}:Eu_z$ powders are used as precursor powders to form a ceramic. To adjust the oxygen content of the precursor powder, a ratio [Ba]+[Sr]+[Eu]/[Si] may be at least 0.4 in some embodiments and no more than 0.45 in some embodiments. Suitable starting materials for the precursor powder synthesis include, for example, barium (strontium, europium) nitride, barium (strontium, europium) hydride, barium (strontium, europium) amide, barium (strontium, europium) silicides, europium oxide, europium nitridosilicate ($Eu_2Si_5N_8$), europium fluoride, silicon, silicon nitride, silicon diimide, or perhydropolysilazane.

Mixtures of the starting materials are fired under nitrogen in some embodiments, or nitrogen-hydrogen mixtures in some embodiments, at temperatures of at least 1300° C. in some embodiments and no more than 1600° C. in some embodiments, to obtain the raw precursor powders. These raw precursor powders, consisting of $(Ba_{1-x}Sr_x)_{2-z}Si_{5-y}O_{4y}N_{8-4y}:Eu_z$ phase, are milled and washed with diluted mineral acids to obtain the ceramic precursor powder. X-ray powder diffraction (XRD) analysis shows a single phase of 258 material; analysis of the total oxygen content shows values in the 1-3 wt % range.

The precursor powder may be formed by any suitable technique. Embodiments of the invention are not limited to the process described above.

The precursor powder is then transferred into a ceramic green body by means of granulation followed by uniaxial pressing or isostatic pressing, tape casting, roll compaction, gel casting, injection molding, slip casting, or any other suitable technique.

After binder burn out, for example in air or under nitrogen, for example at temperatures in the 350-900° C. range, ceramic green bodies are fired (sintered) at temperatures in the 1600-1700° C. range under flowing nitrogen in some embodiments, or nitrogen-hydrogen mixtures in some embodiments, at ambient pressure in conventional high temperature furnaces. The ceramic green bodies and the sintered ceramics may be formed by any suitable technique. Embodiments of the invention are not limited to the process described above.

As analyzed by XRD, the as-fired ceramics consist of 3-4 crystalline phases, including $M_2Si_{5-y}O_{4y}N_{8-4y}$ (80-95 wt %), $M_2SiO_4$ (2-10 wt %), $M_3Si_3O_3N_4$ (2-20 wt %), and $MSi_7N_{10}$ (0-2 wt %) (M=Ba, Sr, Eu).

Figure 7:
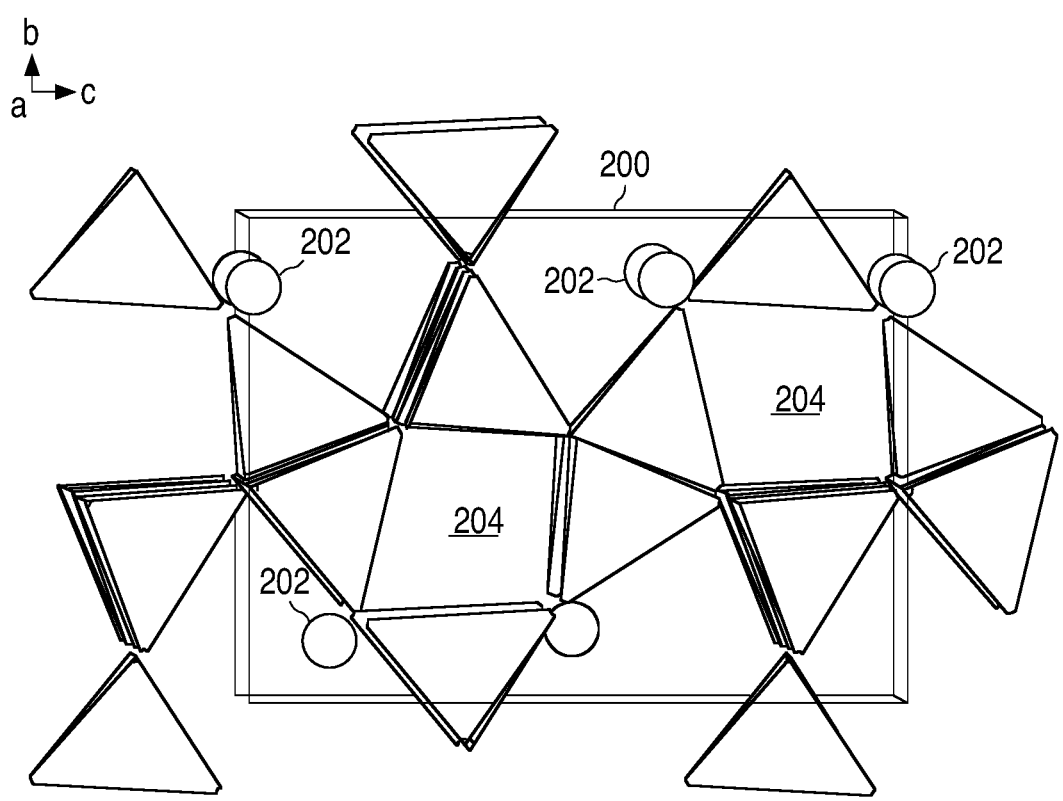
FIG. 7 illustrates the 258 lattice unit cell.

The $M_2Si_{5-y}O_{4y}N_{8-4y}$ (258 phase, M=Ba, Sr, Eu), characterized by partial removal of $SiN_4$ building blocks and replacement by $V_{Si}O_4$ units ($V_{Si}$: silicon vacancy), crystallizes in a defect variant of the nominally oxygen free 258 compounds. As for the case of the isotypic 258 SiAlON compounds $M_{2-x}Si_{5-y}Al_yO_yN_{8-y}:Eu_x$ where (Si,N) replacement by (Al,O) leads to anisotropic changes of lattice constants, a similar change of lattice constants is found for the $M_2Si_{5-y}O_{4y}N_{8-4y}$ ceramic main phase, a contraction along the crystallographic b axis and an expansion within the (1 0 1) plane of the orthorhombic unit cell. The 258 lattice unit cell is illustrated in FIG. 7. In FIG. 7, the directions lattice constant cell axes a, b, and c are shown as arrows. The box 200 is the unit cell. The balls 202 are the M=Ba, Sr, Eu atoms. The tetrahedral 204 represent the $Si(N,O)_4$ units with the Si atoms (or the Si vacancies) in the middle and the N or O atoms at the vertices. The O content of the 258 phase, characterized by the parameter y, may thus correlate with the lattice constant ratio $a*c/b^2$.

The $M_3Si_3O_3N_4$ (3334 phase, M=Ba, Sr, Eu) phase crystallizes in an orthorhombic structure type (IUC space group Nr. 59, P mmn). One $SiN_2O_2$ and two $SiN_3O$ tetrahedra are vertex connected to form star-shaped $[Si_3N_6O_3]^{12-}$ units that are further condensed via vertex-sharing to form corrugated $[Si_3O_3N_4]^{6-}$ layers within the (110) plane. M atoms are located between the layers. The structure is illustrated in FIG. 1, where the smallest spheres 106 are O, the larger spheres 104 are N, the largest spheres 102 are M, and the Si atoms are not shown.

The $M_2SiO_4$ orthosilicate phase (BOSE phase, M=Ba, Sr, Eu) also crystallizes in an orthorhombic structure type.

The $MSi_7N_{10}$ phase (1710 phase, M=Ba, Sr, Eu) crystallizes in a monoclinic structure type.

The inventors have observed that the anisotropic change of lattice constants of the $M_2Si_{5-y}O_{4y}N_{8-4y}$ (258 phase, M=Ba, Sr, Eu), which is believed to scale with the y parameter, correlates with the relative content of $M_3Si_3O_3N_4$ (3334 phase, M=Ba, Sr, Eu) phase, but no correlation is observed with the relative content of $M_2SiO_4$ orthosilicate phase (BOSE phase, M=Ba, Sr, Eu).

Since the 3334 phase absorbs blue light without showing wanted amber emission and easily hydrolyzes in moist air, in some embodiments, amber-emitting luminescent ceramics are formed with a low 3334 phase content, to increase the luminescence conversion efficiency and the chemical stability of the ceramics. The content of 3334 phase is less than 10 wt % in some embodiments (relative to the total amount of crystalline phases in the ceramic), no more than 7 wt % in some embodiments, less than 5 wt % in some embodiments, less than 2 wt % in some embodiments, at least 1 wt % in some embodiments, and 0 wt % in some embodiments. The content of BOSE phase is no more than 7 wt % in some embodiments, and 0 wt % in some embodiments. The content of 1710 phase is less than 5 wt % in some embodiments, and 0 wt % in some embodiments.

In embodiments of the invention, the amount of 3334 phase in as-sintered amber-emitting luminescent $(Ba,Sr,Ca)_{2-x}Si_{5-y}Al_yO_yN_{8-y}:Eu_x$ ceramics can be reduced by a thermal treatment, post-sintering. The post-sintering thermal treatment may be performed under increased nitrogen pressure and at temperatures exceeding 1400° C. in some embodiments. The post-sintering thermal treatment is performed at a temperature of at least 1350° C. in some embodiments and no more than 1700° C. in some embodiments, under nitrogen pressure of at least 20 MPa in some embodiments and not more than 300 MPa in some embodiments, and with dwell times of at least 0.5 hr in some embodiments and no more than 24 hr in some embodiments. The post-sintering thermal treatment may be performed at a temperature of at least 1450° C. in some embodiments and not more than 1550° C. in some embodiments, under nitrogen pressure of at least 50 MPa in some embodiments and not more than 150 MPa in some embodiments, and with dwell times of at least 4 hr in some embodiments and not more than 8 hr in some embodiments.

The post-sintering thermal treatment reduces the amount (weight percent) of 3334 phase, increases the amount of BOSE phase, and leads to a decrease of the O content of the 258 phase according to the formula:

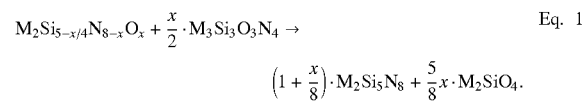

$$M_2Si_{5-x/4}N_{8-x}O_x + \frac{x}{2} \cdot M_3Si_3O_3N_4 \rightarrow \qquad \text{Eq. 1}$$
$$\left(1 + \frac{x}{8}\right) \cdot M_2Si_5N_8 + \frac{5}{8}x \cdot M_2SiO_4.$$

When the 1710 phase is also present, 3334 phase reduction may also take place according to:

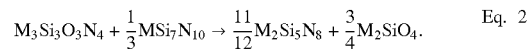

$$M_3Si_3O_3N_4 + \frac{1}{3}MSi_7N_{10} \rightarrow \frac{11}{12}M_2Si_5N_8 + \frac{3}{4}M_2SiO_4. \qquad \text{Eq. 2}$$

Equations 1 and 2 may be combined to describe annealing reactions where in general the amount of the 3334 phase is reduced and the amount of the BOSE phase is increased.

By reducing the amount of the 3334 phase, the quantum yield (defined as the number of emitted amber light quanta divided by number of absorbed blue LED light quanta) of the amber-emitting luminescent ceramics, and the transmission of red light through the ceramic, may increase.

Figure 2:
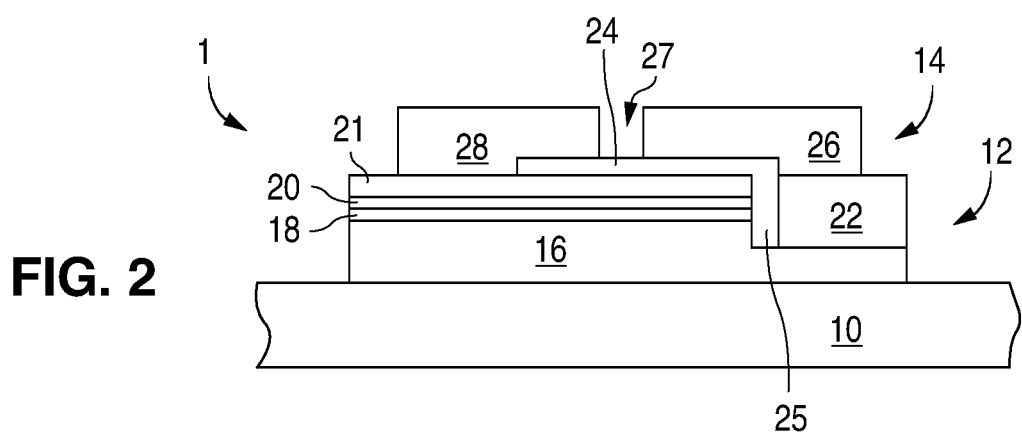
FIG. 2 is a cross sectional view of an LED.

The wavelength converting materials described above may be used, for example, in a light source including a light emitting diode (LED). Light emitted by the light emitting diode is absorbed by the wavelength converting material according to embodiments of the invention and emitted at a different wavelength. FIG. 2 illustrates one example of a suitable light emitting diode, a III-nitride LED that emits blue light.

Though in the example below the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

FIG. 2 illustrates a III-nitride LED 1 that may be used in embodiments of the present invention. Any suitable semiconductor light emitting device may be used and embodiments of the invention are not limited to the device illustrated in FIG. 2. The device of FIG. 2 is formed by growing a III-nitride semiconductor structure on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 2. The n- and p-contacts may be redistributed to form bond pads with a dielectric/metal stack, as is known in the art.

In order to form electrical connections to the LED 1, one or more interconnects 26 and 28 are formed on or electrically connected to the n- and p-contacts 22 and 21. Interconnect 26 is electrically connected to n-contact 22 in FIG. 5. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure.

The substrate 10 may be thinned or entirely removed. In some embodiments, the surface of substrate 10 exposed by thinning is patterned, textured, or roughened to improve light extraction.

Any suitable light emitting device may be used in light sources according to embodiments of the invention. The invention is not limited to the particular LED illustrated in FIG. 2. The light source, such as, for example, the LED illustrated in FIG. 2, is illustrated in the following figures by block 1.

Figure 3:
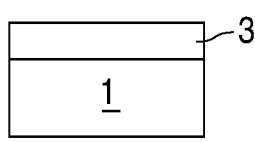
FIG. 3 is a cross sectional view of a device with a wavelength converting structure in direct contact with an LED.
Figure 4:
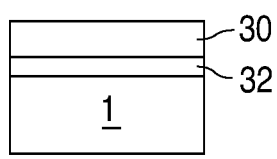
FIG. 4 is a cross sectional view of a device with a wavelength converting structure in close proximity to an LED.
Figure 5:
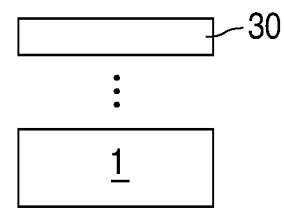
FIG. 5 is a cross sectional view of a device with a wavelength converting structure spaced apart from an LED.

FIGS. 3, 4, and 5 illustrate devices that combine an LED 1 and a wavelength converting structure 30. The wavelength converting structure 30 may be an amber-emitting luminescent ceramic tile, according to the embodiments and examples described above.

In FIG. 3, the wavelength converting structure 30 is directly connected to the LED 1. For example, the wavelength converting structure may be directly connected to the substrate 10 illustrated in FIG. 2, or to the semiconductor structure, if the substrate 10 is removed.

In FIG. 4, the wavelength converting structure 30 is disposed in close proximity to LED 1, but not directly connected to the LED 1. For example, the wavelength converting structure 30 may be separated from LED 1 by an adhesive layer 32, a small air gap, or any other suitable structure. The spacing between LED 1 and the wavelength converting structure 30 may be, for example, less than 500 µm in some embodiments.

In FIG. 5, the wavelength converting structure 30 is spaced apart from LED 1. The spacing between LED 1 and the wavelength converting structure 30 may be, for example, on the order of millimeters in some embodiments. Such a device may be referred to as a "remote phosphor" device. Remote phosphor arrangements may be used, for example, in backlights for displays.

The wavelength converting structure 30 may be square, rectangular, polygonal, hexagonal, circular, or any other suitable shape. The wavelength converting structure may be the same size as LED 1, larger than LED 1, or smaller than LED 1.

Multiple wavelength converting materials and multiple wavelength converting structures can be used in a single device. Examples of wavelength converting structures other than the luminescent ceramic tiles described above include wavelength converting materials such as powder phosphors that are disposed in transparent material such as silicone or glass that is rolled, cast, or otherwise formed into a sheet, then singulated into individual wavelength converting structures; wavelength converting materials such as powder phosphors that are disposed in a transparent material such as silicone that is formed into a flexible sheet, which may be laminated or otherwise disposed over an LED 1, wavelength converting materials such as powder phosphors that are mixed with a transparent material such as silicone and dispensed, screen printed, stenciled, molded, or otherwise disposed over LED 1; and wavelength converting materials that are coated on LED 1 or another structure by electrophoretic, vapor, or any other suitable type of deposition.

In addition to the luminescent ceramic tiles described above, a device may also include other wavelength converting materials such as, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce.

The wavelength converting materials absorb light emitted by the LED and emit light of one or more different wavelengths. Unconverted light emitted by the LED is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light extracted from the structure.

Multiple wavelength converting materials may be mixed together or formed as separate structures.

In some embodiments, a blue-emitting LED is combined with an amber-emitting luminescent ceramic as described above, and with a red-emitting wavelength converting material. Light from the LED, the luminescent ceramic, and the red-emitting wavelength converting material combine such that the device emits light that appears white.

In some embodiments, other materials may be added to the wavelength converting structure or the device, such as, for example, materials that improve optical performance, materials that encourage scattering, and/or materials that improve thermal performance.

EXAMPLE

Synthesis of amber-emitting ceramics: 94.1 g $Si_3N_4$ (>98%), 0.895 g $Eu_2O_3$ (99.99%), 22.351 g $SrH_2$ (>99%) and 82.651 g $BaH_2$ (>99%) are mixed by ball milling and fired at 1450° C. in a mixture of hydrogen and nitrogen (5:95 ratio). After ball milling, the powder is washed with 2N HCl, rinsed with water and alcohol. After drying, a phase pure 258 powder is obtained (orthorhombic, refined lattice constants: a=5.7585(4) Å, b=6.9158(8) Å, c=9.3635(4) Å, V=372.9058 (4) Å$^3$). The washed powder is then dispersed in water with a dispersing aid (Disperbyk) and milled down to an average particle size of 1.3 (±0.2) μm. After granulation with polyvinyl alcohol, ceramic green body disks are being pressed uniaxially followed by a binder burnout step at 350° C. in air. After sintering at 1650° C. in a mixture of hydrogen and nitrogen (5:95 ratio), the ceramics are ground to a thickness of 320 μm and cleaned in an ultrasonic bath.

Post-sintering thermal treatment: Thinned ceramics are annealed at 1500° C. in nitrogen (100 MPa) for 4 hours in a graphite furnace.

Figure 6:
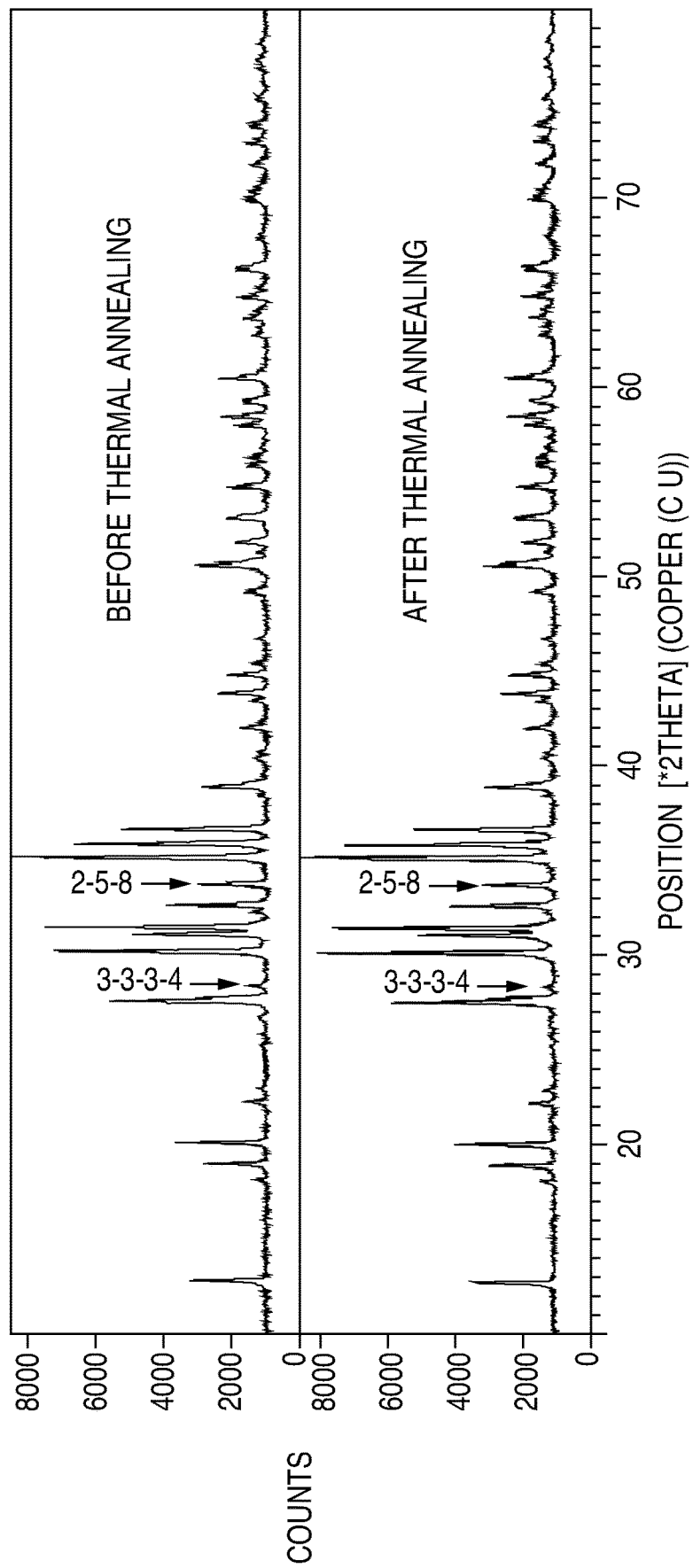
FIG. 6 illustrates the X-ray powder diffraction patterns of ceramics before post-sintering thermal treatment and after post-sintering thermal treatment.

FIG. 6 illustrates the X-ray powder patterns of ceramic samples as described above, before post-sintering thermal treatment and after post-sintering thermal treatment. Both samples were crushed to powder before the XRD measurement and measured with Cu Kα radiation under dry air to prevent 3334 phase hydrolysis during measurement.

The 3334 phase shows a distinct peak at 2θ=28.3° which corresponds to the 3334 phase X-ray reflection hkl=012. The intensity of this peak is compared with the intensity of the 258 peak at 2θ=33.64°, which corresponds to the 258 phase X-ray reflection hkl=210. The intensity ratio I(012)$_{3334}$/I (210)$_{258}$ is decreased significantly by the post-sintering thermal treatment. In particular, the intensity ratio $I_{3334}$ (28.3°)/$I_{258}$ (33.64°) is 0.24 before post-sintering thermal treatment, and 0.15 after post-sintering thermal treatment. In some embodiments, a ratio of the intensity of an X-ray powder diffraction peak of the 3334 phase to the intensity of an X-ray powder diffraction peak of the 258 phase is in the range 0-0.25.

The cell constant ratio a*c/b$^2$ of the 258 phase also decreases with post-sintering thermal treatment. In particular, the ratio a*c/b$^2$ is 1.1304 before post-sintering thermal treatment, and 1.1297 after post-sintering thermal treatment. The cell constant ratio a*c/b$^2$ may be between 1.1290 and 1.1305 in some embodiments.

In some embodiments, the material has lattice symmetry characterized by IUC space group Pmn2$_1$. The International Union of Crystallography (IUC) publishes the International Tables of Crystallography which lists the 230 space groups and their symmetry relations. The space group number 31 characterized with the Wyckoff symbol Pmn2$_1$ is the space group in which the 258 phase is crystallizing.

The optical performance of the ceramic samples is increased by the post-sintering thermal treatment as illustrated by the quantum efficiency and the transparency of the ceramic samples. In the example above, the quantum efficiency increased by a factor of 1.3 with post-sintering thermal treatment, while the transparency increased by a factor of 1.1 with post-sintering thermal treatment.

The composition of samples produced according to the example above can be determined by Rietveld analysis of the X-ray patterns. The following table shows the relative content of phases in weight % present before and after thermal treatment:

| Sample | 258 | 1-7-10 | 3-3-3-4 | BOSE |
| --- | --- | --- | --- | --- |
| 1, as sintered | 89.9 | 0.04 | 8.66 | 1.39 |
| 2, as sintered | 91.3 | 0.01 | 7.53 | 1.16 |
| 3, as sintered | 89.35 | 0.31 | 8.75 | 1.58 |
| 1, treated | 92.65 | 0.15 | 3.86 | 3.34 |
| 2, treated | 93.81 | 0 | 3.01 | 3.18 |
| 3, treated | 92.91 | 0 | 4.27 | 2.82 |
| 4, as sintered | 92.33 | 0.22 | 6.63 | 0.83 |
| 5, as sintered | 91.56 | 0.18 | 7.74 | 0.52 |
| 6, as sintered | 90.96 | 0.19 | 7.86 | 0.99 |
| 4, treated | 93.2 | 0 | 2.55 | 4.26 |
| 5, treated | 93.01 | 0.25 | 3.62 | 3.12 |
| 6, treated | 93.63 | 0 | 2.37 | 4.00 |

The values in the above table may be used as end points in ranges of the weight percent of each phase. It is observed that the 3334 content is reduced from ~7-9 wt % to 3-4 wt % while the BOSE content increases from 1-2 wt % to 3-4 wt %. The concentration of 1710 phase in these samples is low, below 1 wt %.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A wavelength converting material, comprising:
a ceramic material comprising:
a $(Ba_{1-x}Sr_x)_{2-z}Si_{5-y}O_{4y}N_{8-4y}:Eu_z$ wavelength converting material in a first crystalline phase where 0.5≤x≤0.9; 0≤y≤1; and 0.001≤z≤0.02; and
a $M_3Si_3O_3N_4$ material in a second crystalline phase where M is Ba, Sr, Eu, or combinations thereof; the second crystalline phase different from the first crystalline phase and comprising no more than 5 weight % of a total amount of crystalline phases in the ceramic material.

2. The wavelength converting material of claim 1, wherein the first crystalline phase has an orthorhombic lattice metric and a cell constant ratio a*c/b$^2$ between 1.1290 and 1.1205.

3. The wavelength converting material of claim 1, wherein the first crystalline phase has lattice symmetry characterized by IUC space group Pmn2$_1$.

4. The wavelength converting material of claim 1, wherein a ratio of an intensity of an X-ray powder diffraction peak of the second crystalline phase to an intensity of an X-ray powder diffraction peak of the first crystalline phase is in the range 0-0.25.

5. The wavelength converting material of claim 1, wherein the ceramic material further comprises a $M'_2SiO_4$ material in a third crystalline phase where M' is Ba, Sr, Eu, or combinations thereof, the third crystalline phase different from the first and second crystalline phases, the third crystalline phase comprising no more than 7 weight % of the total amount of crystalline phases in the ceramic material.

6. The wavelength converting material of claim 1, wherein the ceramic material further comprises a $M''Si_7N_{10}$ material in a fourth crystalline phase where M" is Ba, Sr, Eu, or combinations thereof, the fourth crystalline phase different from the first and second crystalline phases, the fourth crystalline phase comprising less than 5 weight % of the total amount of crystalline phases in the ceramic material.

7. A device, comprising:
a light emitting diode that emits blue light; and
a wavelength converting ceramic disposed in a path of the blue light, the wavelength converting ceramic comprising:
a $(Ba_{1-x}Sr_x)_{2-z}Si_{5-y}O_{4y}N_{8-4y}{:}Eu_z$ wavelength converting material in a first crystalline phase where $0.5 \le x \le 0.9$; $0 \le y \le 1$; and $0.001 \le z \le 0.02$; and
a $M_3Si_3O_3N_4$ material in a second crystalline phase where M is Ba, Sr, Eu, or combinations thereof; the second crystalline phase different from the first crystalline phase and comprising no more than 5 weight % of a total amount of crystalline phases in the wavelength converting ceramic.

8. The device of claim 7, wherein the wavelength converting ceramic further comprises a $M'_2SiO_4$ material in a third crystalline phase where M' is Ba, Sr, Eu, or combinations thereof, the third crystalline phase different from the first and second crystalline phases, the third crystalline phase comprising no more than 7 weight % of the total amount of crystalline phases in the wavelength converting ceramic.

9. The device of claim 7, wherein the wavelength converting ceramic further comprises a $M''Si_7N_{10}$ material in a fourth crystalline phase where M" is Ba, Sr, Eu, or combinations thereof, the fourth crystalline phase different from the first and second crystalline phases, the fourth crystalline phase comprising less than 5 weight % of the total amount of crystalline phases in the wavelength converting ceramic.

10. The device of claim 7, wherein the wavelength converting ceramic emits amber light, the device further comprising a wavelength converting material that emits red light.

11. A method for preparing a ceramic, comprising:
forming precursors;
transferring the precursors into a ceramic green body;
firing or sintering the ceramic green body to form a ceramic comprising a $(Ba_{1-x}Sr_x)_{2-z}Si_{5-y}O_{4y}N_{8-4y}{:}Eu_z$ wavelength converting material in a first crystalline phase where $0.5 \le x \le 0.9$; $0 \le y \le 1$; and $0.001 \le z \le 0.02$; and a $M_3Si_3O_3N_4$ material in a second crystalline phase where M is Ba, Sr, Eu, or combinations thereof, the second crystalline phase different from the first crystalline phase; and
after forming the ceramic, reducing a weight percent of the second crystalline phase material.

12. The method of claim 11, wherein reducing a weight percent of the second crystalline phase comprises heating the ceramic to a temperature between 1350 and 1700° C. under a nitrogen pressure between 20 and 300 MPa for between 0.5 and 24 hours.

13. The method of claim 11, wherein reducing a weight percent of the second crystalline phase comprises heating the ceramic to a temperature between 1450 and 1550° C. under a nitrogen pressure between 50 and 150 MPa for between 4 and 8 hours.

14. The method of claim 11, wherein reducing a weight percent of the second crystalline phase comprises reducing the weight percent to no more than 10 weight percent of total crystalline phases in the ceramic.

15. The method of claim 11, wherein reducing a weight percent of the second crystalline phase comprises reducing the weight percent to no more than 5 weight percent of total crystalline phases in the ceramic.

* * * * *